United States Patent
He et al.

(10) Patent No.: US 9,871,049 B1
(45) Date of Patent: Jan. 16, 2018

(54) STATIC RANDOM ACCESS MEMORY DEVICE AND FORMING METHOD THEREOF

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/593,345

(22) Filed: May 12, 2017

(30) Foreign Application Priority Data

Apr. 5, 2017 (CN) .......................... 2017 1 0217036

(51) Int. Cl.
| | |
|---|---|
| H01L 29/06 | (2006.01) |
| H01L 47/00 | (2006.01) |
| H01L 27/11 | (2006.01) |
| H01L 23/48 | (2006.01) |
| H01L 45/00 | (2006.01) |
| H01L 27/24 | (2006.01) |
| H01L 23/525 | (2006.01) |
| H01L 23/532 | (2006.01) |
| G11C 14/00 | (2006.01) |
| G11C 11/419 | (2006.01) |

(52) U.S. Cl.
CPC ........ *H01L 27/1116* (2013.01); *G11C 11/419* (2013.01); *G11C 14/009* (2013.01); *H01L 23/481* (2013.01); *H01L 23/525* (2013.01); *H01L 23/532* (2013.01); *H01L 27/1104* (2013.01); *H01L 27/2463* (2013.01); *H01L 45/06* (2013.01); *H01L 45/1233* (2013.01); *H01L 45/143* (2013.01); *H01L 45/144* (2013.01)

(58) Field of Classification Search
CPC .. H01L 27/1116; H01L 27/2463; H01L 45/06; H01L 45/1233; H01L 23/532; H01L 45/144; H01L 45/143; H01L 23/481; H01L 27/1104; H01L 23/525; G11C 11/419; G11C 14/009
See application file for complete search history.

(56) References Cited

U.S. PATENT DOCUMENTS

| | | |
|---|---|---|
| 7,760,538 B1 | 7/2010 | Paak |
| 8,508,983 B2 | 8/2013 | Wang |
| 9,734,905 B2 * | 8/2017 | Baker, Jr. ........... G11C 13/0069 |

(Continued)

*Primary Examiner* — Victor A Mandala
(74) *Attorney, Agent, or Firm* — Winston Hsu

(57) ABSTRACT

A static random access memory device includes two body contacts and two resistive-switching devices. The body contacts are disposed in a wafer and are exposed from a back side of the wafer, wherein the body contacts electrically connect a static random access memory cell through a metal interconnect in the wafer. The resistive-switching devices connect the two body contacts respectively from the back side of the wafer. A method of forming a static random access memory device is also provided in the following. A wafer having two body contacts exposed from a back side of the wafer and a metal interconnect electrically connecting a static random access memory cell to the body contacts is provided. Two resistive-switching devices are formed to connect the two body contacts respectively from the back side of the wafer.

20 Claims, 4 Drawing Sheets

(56) References Cited

U.S. PATENT DOCUMENTS

| | | | |
|---|---|---|---|
| 2011/0085372 A1* | 4/2011 | Fackenthal | G11C 13/0004 |
| | | | 365/156 |
| 2013/0135921 A1* | 5/2013 | Owada | G11C 11/21 |
| | | | 365/148 |
| 2013/0153848 A1* | 6/2013 | Park | H01L 27/228 |
| | | | 257/2 |
| 2013/0168631 A1* | 7/2013 | Chen | H01L 27/2436 |
| | | | 257/4 |
| 2014/0177356 A1* | 6/2014 | Su | G11C 7/1096 |
| | | | 365/189.16 |
| 2015/0318024 A1* | 11/2015 | Baker, Jr. | G11C 13/0069 |
| | | | 365/72 |
| 2016/0126291 A1* | 5/2016 | Lu | H01L 27/2463 |
| | | | 257/5 |
| 2017/0069827 A1* | 3/2017 | Lee | H01L 43/08 |
| 2017/0117326 A1* | 4/2017 | Boivin | H01L 27/2445 |
| 2017/0221563 A1* | 8/2017 | Taniguchi | G11C 13/0069 |
| 2017/0221905 A1* | 8/2017 | Chen | H01L 21/823821 |
| 2017/0229178 A1* | 8/2017 | Widjaja | G11C 14/0045 |

* cited by examiner

STATIC RANDOM ACCESS MEMORY DEVICE AND FORMING METHOD THEREOF

BACKGROUND OF THE INVENTION

1. Field of the Invention

The present invention relates generally to a memory device and forming method thereof, and more specifically to a static random access memory device and forming method thereof.

2. Description of the Prior Art

Random access memory (RAM) can be operated to read data from it and write data into it. As computers containing RAM turn off, data disappears from the RAM immediately. Since data in RAM can be altered easily, RAM is widely used as temporary data storage memory in personal computers. RAM can be classified into dynamic-type and static-type.

A dynamic random access memory (DRAM: Dynamic RAM) stores one-bit data by one transistor paired with one capacitor, and electricity must be supported during operating to keep this data, thus called Dynamic RAM. Dynamic RAM is a simple structure, therefore having slow access speed and low cost. Thus, it is often used as a memory providing high capacity but low speed such as a main memory of a personal computer.

A static random access memory (SRAM: Static RAM) stores one-bit data by six transistors, and electricity is not needed during operating to keep this data, thus called Static RAM. Static RAM is a complex structure, therefore having high access speed and high cost, thereby it is often used as a memory providing low capacity but high speed such as a 256 KB or 512 KB cache memory built-in a central processing unit (CPU) of a personal computer. Since a CPU mainly affects data calculating and processing speed of a computer while a main memory mainly affects data storage capacity, a cache memory is utilized to save often-used data, thereby the CPU can more quickly reach this often-used data stored in the cache memory, without reaching it in the main memory.

SUMMARY OF THE INVENTION

The present invention provides a static random access memory device, which has resistive-switching devices electrically connecting a static random access memory cell, thereby decreasing the interference of reading and writing and reducing the soft error rate (SER).

The present invention provides a static random access memory device including two body contacts and two resistive-switching devices. The body contacts are disposed in a wafer and are exposed from a backside of the wafer, wherein the body contacts electrically connect a static random access memory cell through a metal interconnect structure. The resistive-switching devices connect the body contacts respectively from the backside of the wafer.

The present invention provides a method of forming a static random access memory device including the following step. A wafer is provided, wherein two body contacts are exposed from a backside of the wafer, and the body contacts electrically connect a static random access memory cell through a metal interconnect structure. Two resistive-switching devices are formed to connect the body contacts respectively from the backside of the wafer.

According to the above, the present invention provides a static random access memory device and forming method thereof, which has two resistive-switching devices, and two body contacts in a wafer electrically and respectively connecting the resistive-switching devices to a static random access memory cell, thereby reducing circuit leakage, decreasing the interference of reading and writing and reducing the soft error rate (SER).

These and other objectives of the present invention will no doubt become obvious to those of ordinary skill in the art after reading the following detailed description of the preferred embodiment that is illustrated in the various figures and drawings.

DETAILED DESCRIPTION

Figure 1:
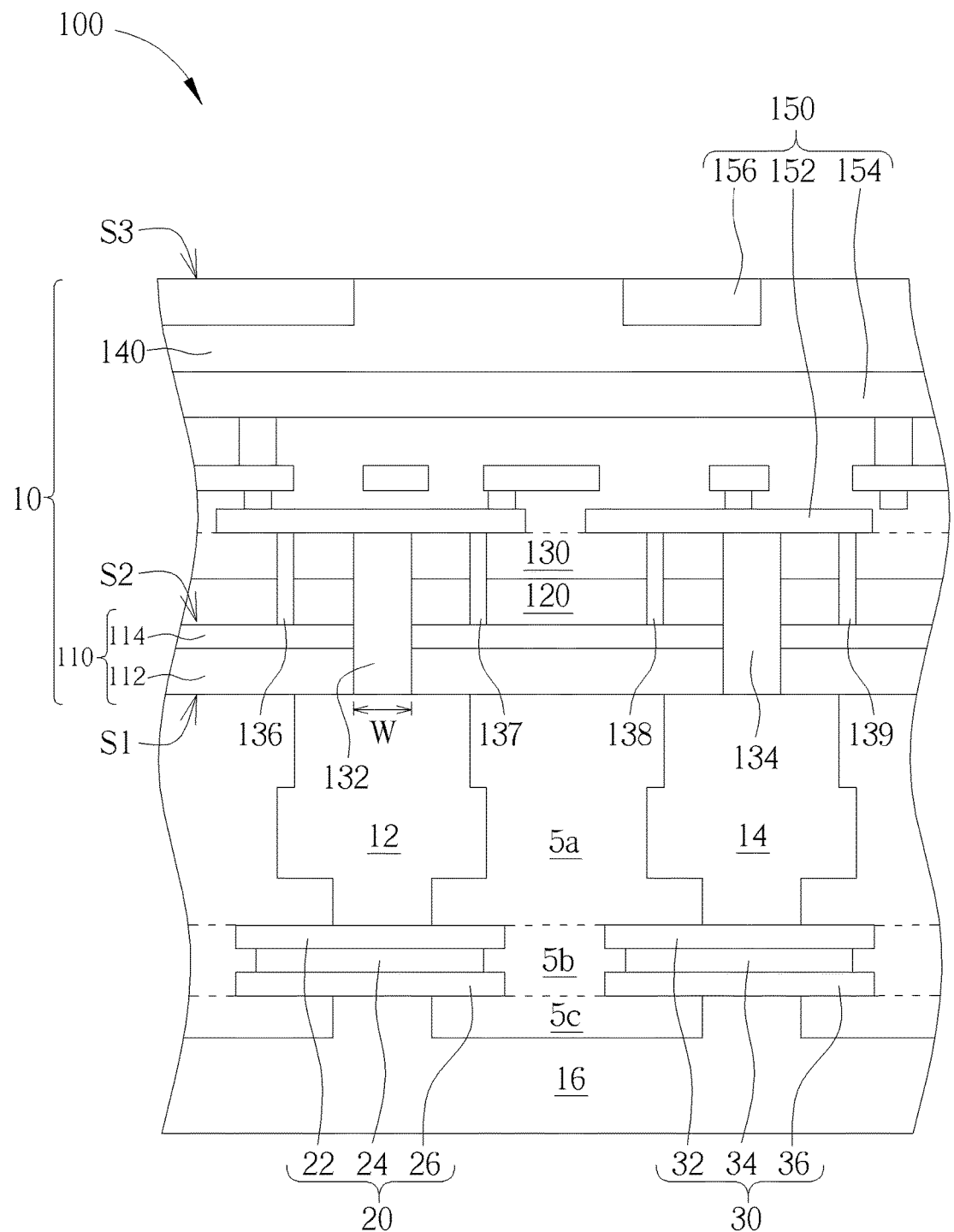
FIG. 1 schematically depicts a cross-sectional view of a static random access memory device according to an embodiment of the present invention.

FIG. 1 schematically depicts a cross-sectional view of a static random access memory device according to an embodiment of the present invention. As shown in FIG. 1, a wafer 10 is provided. The wafer 10 includes a substrate 110, wherein the substrate 110 has a backside S1 and a front side S2. The substrate 110 may be a semiconductor substrate such as a silicon substrate, a silicon containing (such as silicon carbide) substrate, a III-V group-on-silicon (such as GaN-on-silicon) substrate, a graphene-on-silicon substrate, a silicon-on-insulator (SOI) substrate or a substrate containing epitaxial layers. In this embodiment, the substrate 110 is a silicon-on-insulator (SOI) substrate, thereby the substrate 110 has a bottom layer (not shown, which will be removed while the wafer 10 is reserved and thinned in later processes), an oxide layer 112 and a top layer 114 stacked from bottom to top. In this embodiment, the top layer 114 is a silicon layer, and the thickness of the top layer 114 is 500 angstroms, but it is not limited thereto. A static random access memory cell 120 is formed on the front side S2 of the substrate 110. The static random access memory cell 120 is composed of six transistors, which may be two pass-gate MOS transistors (PG MOSFET), two pull-down MOS transistors (PD MOSFET) and two pull-up MOS transistors (PL MOSFET), and the methods of forming the static random access memory cell 120 are well known in the art and are not described herein.

A dielectric layer 130 covers the static random access memory cell 120 and the substrate 110, and then two body contacts 132/134 are formed in the dielectric layer 130 and penetrate the oxide layer 112 and the top layer 114 from the front side S2 of the substrate 110. The dielectric layer 130 may be an inter dielectric layer (ILD), which can be composed of oxide, and the body contacts 132/134 may be composed of conductive materials such as copper, aluminum or tungsten etc. Widths W of the body contacts 132/134 are 100 nanometers, but it is not limited thereto. In this embodiment, the body contacts 132/134 and the contact plugs 136/137/138/139 connecting the six transistors of the static random access memory cell 120 (only four contact plugs 136/137/138/139 are depicted for simplification) are formed at the same time, to simplify processes. The body contacts 132/134 and the contact plugs 136/137/138/139 have common materials, which may be composed of copper, aluminum, tungsten or etc. Top surfaces of the body contacts 132/134 trim top surfaces of the contact plugs 136/137/138/139, but it is not limited thereto. Methods of forming the body contacts 132/134 and the contact plugs 136/137/138/139 may be: the dielectric layer 130, the top layer 114 and the oxide layer 112 are etched to form recesses in the dielectric layer 130, the top layer 114 and the oxide layer 112, and then conductive materials fill into the recesses to form the body contacts 132/134 and the contact plugs 136/137/138/139, but it is not limited thereto.

A dielectric layer 140 covers the body contacts 132/134, the contact plugs 136/137/138/139 and the dielectric layer 130, wherein a metal interconnect structure 150 is formed in the dielectric layer 140. In this embodiment, the dielectric layer 140 is an inter-metal dielectric layer, which may be composed of oxide, but it is not limited thereto. In this embodiment, the metal interconnect structure 150 may be composed of metals such as copper or tungsten etc. In this embodiment, the metal interconnect structure 150 may at least include a first metal layer (metal 1) 152, a second metal layer (metal 2) 154 and a third metal layer (metal 3) 156 from bottom to top. The body contacts 132/134 physically connect the first metal layer (metal 1) 152 of the metal interconnect structure 150. The metal interconnect structure 150 may be formed in the dielectric layer 140 by methods such as dual damascene processes.

By doing this, a wafer 10 of the present invention is formed, which may include the two body contacts 132/134 and the metal interconnect structure 150, and the metal interconnect structure 150 electrically connects the body contacts 132/134 to the static random access memory cell 120. It is emphasized that the body contacts 132/134 and the metal interconnect structure 150 are formed from the front side S2 of the substrate 110.

Then, the wafer 10 is reversed and thinned to remove the aforesaid bottom layer (not shown) and to expose the oxide layer 112. In this way, the body contacts 132/134 penetrating the oxide layer 112 are exposed from the backside S1 of the wafer 10 (or the backside S1 of the substrate 110).

Two resistive-switching devices 20/30 connect the body contacts 132/134 from the backside S1 of the wafer 10. More precisely, a dielectric layer 5a covers the backside S1 of the wafer 10, and then the dielectric layer 5a is patterned to form interconnect structures 12/14 in the dielectric layer 5a, wherein methods of forming the interconnect structures 12/14 may be dual damascene processes. Dielectric layers may be deposited and be patterned, and the resistive-switching devices 20/30 may fill in each layer to form a dielectric layer 5b on the dielectric layer 5a, and the resistive-switching devices 20/30 in the dielectric layer 5b. Each of the resistive-switching devices 20/30 may include a first electrode 22/32, a second electrode 26/36 and a resistive-switching material layer 24/34 sandwiched by the first electrode 22/32 and the second electrode 26/36. The resistive-switching devices 20/30 may include phase change devices (PCD), but is it not restricted thereto. The first electrodes 22/32 and the second electrodes 26/36 may be composed of conductive materials such as aluminum (Al), copper (Cu), platinum (Pt), tantalum (Ta) or tantalum nitride (TaN); the resistive-switching material layers 24/34 may include germanium tellurium material layers (GeTe) or selenium antimony tellurium material layers (SeSbTe), but it is not limited thereto. A dielectric layer 5c covers the dielectric layer 5b, and the dielectric layer 5c is patterned to form an interconnect structure 16 in the dielectric layer 5c and covering the dielectric layer 5c, thereby the resistive-switching devices 20/30 electrically connect to each other.

Figure 2:
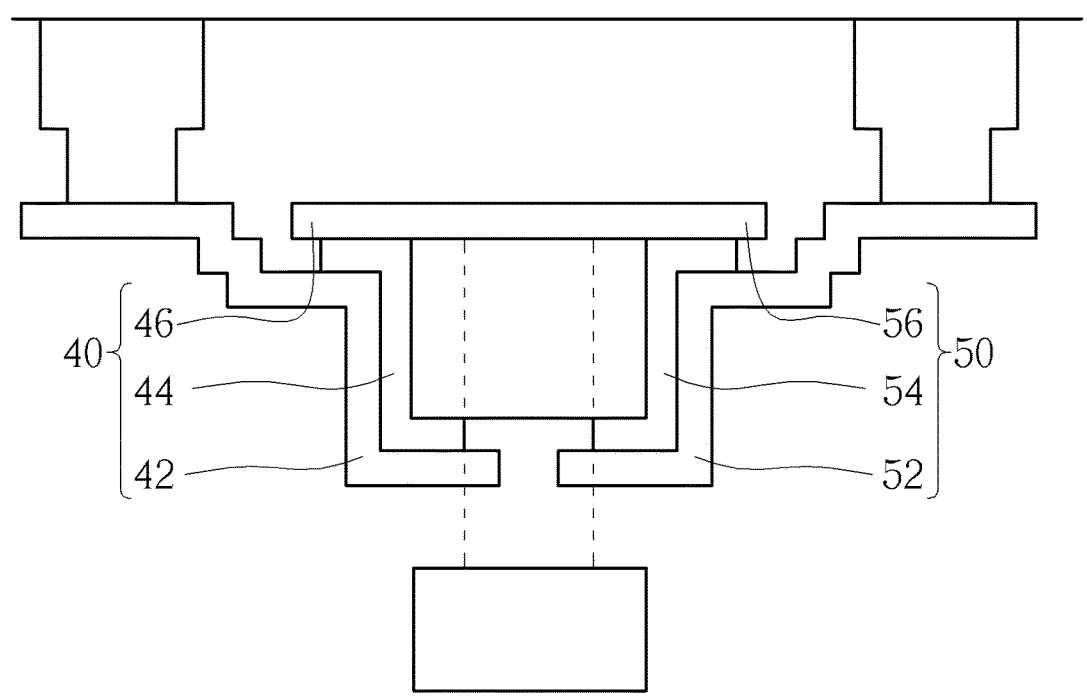
FIG. 2 schematically depicts a cross-sectional view of a resistive-switching device according to an embodiment of the present invention.

In this embodiment, the resistive-switching material layers 24/34 are planar material layers; in another embodiment, the resistive-switching material layers 24/34 may be non-planar material layers. FIG. 2 schematically depicts a cross-sectional view of a resistive-switching device according to an embodiment of the present invention. As shown in FIG. 2, each of the resistive-switching devices 40/50 may include a first electrode 42/52, a second electrode 46/56 and a resistive-switching material layer 44/54 sandwiched by the first electrode 42/52 and the second electrode 46/56, wherein the resistive-switching material layers 44/54 may be non-planar resistive-switching material layers. The resistive-switching devices 40/50 are just one embodiment of non-planar resistive-switching devices of the present invention, but it is not restricted thereto.

Figure 3:
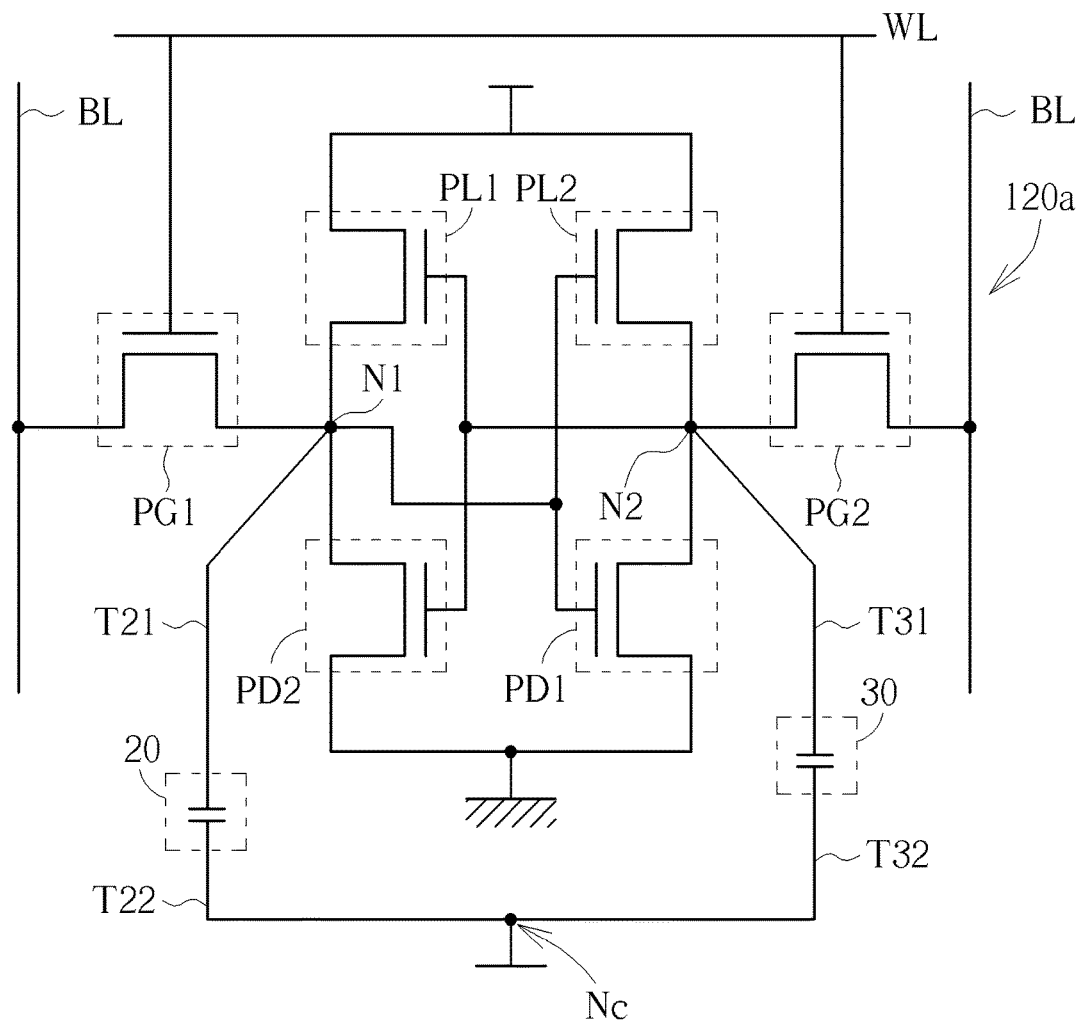
FIG. 3 schematically depicts a circuit layout of a static random access memory device according to an embodiment of the present invention.

Therefore, a static random access memory device 100 having the two body contacts 132/134 electrically connecting the two resistive-switching devices 20/30 to the static random access memory cell 120 is formed. FIG. 3 schematically depicts a circuit layout of a static random access memory device according to an embodiment of the present invention. The static random access memory cell 120 of FIG. 1 has a static random access memory circuit 120a, wherein the static random access memory circuit 120a may include a first storage node N1 and a second storage node N2. The resistive-switching device 20 has a first connect terminal T21 and a second connect terminal T22, and the resistive-switching device 30 has a first connect terminal T31 and a second connect terminal T32. The first connect terminal T21 of the resistive-switching device 20 electrically connects the first storage node N1, and the first connect terminal T31 of the resistive-switching device 30 electrically connects the second storage node N2. The second connect terminal T22 of the resistive-switching device 20 and the second connect terminal T32 of the resistive-switching device 30 electrically connect to a common node NC. By doing this, compared to a modern conventional static random access memory cell, due to the resistive-switching devices 20/30 electrically connecting the first storage node N1 and the second storage node N2, the storage charges in the first storage node N1 and the second storage node N2 can be kept while reading and writing the static random access memory cell 120, thereby avoiding circuit leakage, decreasing the interference of reading and writing, reducing the soft error rate (SER), making writing-in easier, and enhancing the reliability of the static random access memory device.

Figure 4:
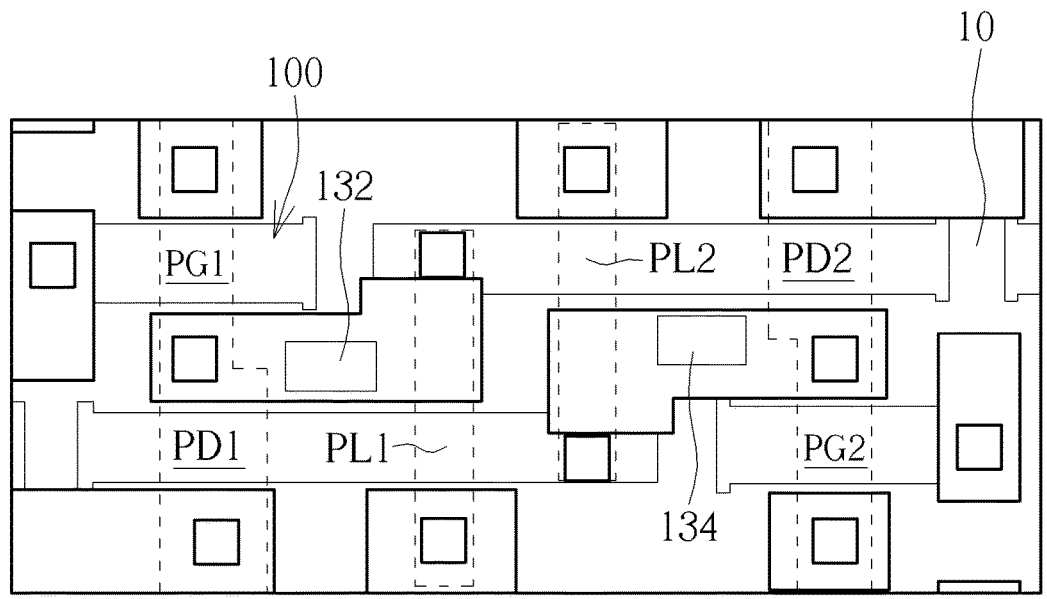
FIG. 4 schematically depicts a top view of a static random access memory device according to an embodiment of the present invention.
Figure 4:
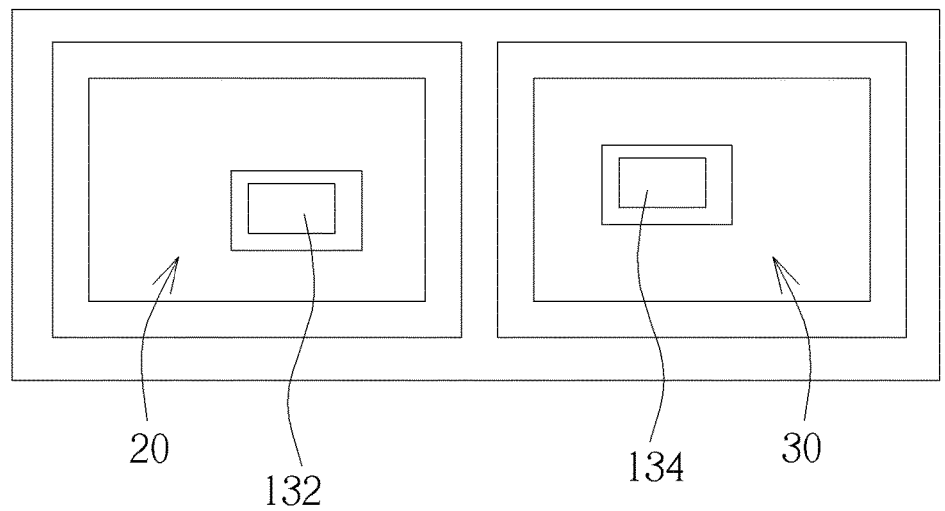

It is emphasized that, the static random access memory device 100 of FIG. 1 has the resistive-switching device 20/30 overlapping the static random access memory cell 120. FIG. 4 schematically depicts a top view of a static random access memory device according to an embodiment of the present invention. The static random access memory device 100 of FIG. 1 is located in the wafer 10, and the static random access memory device 100 may include six transistors, which may be a first pass-gate transistor PG1, a first pull-down transistor PD1 and a first pull-up transistor PL1 symmetrical to a second pass-gate transistor PG2, a second pull-down transistor PD2 and a second pull-up transistor PL2. The body contact 132 is among the layout of the first pass-gate transistor PG1, the first pull-down transistor PD1 and the first pull-up transistor PL1, and the body contact 134 is among the layout of the second pass-gate transistor PG2, the second pull-down transistor PD2 and the second pull-up transistor PL2, as shown in a top diagram of FIG. 4. The body contacts 132/134 connect the resistive-switching devices 20/30 respectively, as shown in a bottom diagram of FIG. 4. Due to a front side S3 of the wafer 10 including the metal interconnect structure 150 having a dense multilayer, the resistive-switching devices 20/30 of the present invention electrically connect the static random access memory cell 120 through the body contacts 132/134 from the backside S2 of the wafer 10. Thereby, the body contacts 132/134 can be kept away from the metal interconnect structure 150, and can vertically overlap the static random access memory cell 120. Thus, this saves the layout area of the static random access memory device 100. In this embodiment, 10%-20% of the layout area of the static random access memory device 100 can be saved.

To summarize, the present invention provides a static random access memory device and forming method thereof, which has two resistive-switching devices, and two body contacts electrically and respectively connecting the resistive-switching devices to a static random access memory cell in a wafer, thereby reducing circuit leakage, decreasing the interference of reading and writing, reducing the soft error rate (SER) and enhancing the reliability of the static random access memory device.

The resistive-switching devices of the present invention electrically connect the static random access memory cell through the body contacts from a backside of the wafer, thereby the body contacts can be kept away from a metal interconnect structure disposed in a front side of the wafer, and the body contacts vertically overlap the static random access memory cell to save the layout area of the static random access memory device. Moreover, the body contacts and the contact plugs connecting transistors can be formed from the front side of the wafer at the same time to simplify processes and reduce processing costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory device, comprising:
   two body contacts disposed in a wafer and exposed from a backside of the wafer, wherein the body contacts electrically connect a static random access memory cell through a metal interconnect structure in the wafer; and
   two resistive-switching devices connecting the body contacts respectively from the backside of the wafer.

2. The static random access memory device according to claim 1, wherein the body contacts physically connect a first metal layer of the metal interconnect structure.

3. The static random access memory device according to claim 1, wherein the resistive-switching devices overlap the static random access memory cell.

4. The static random access memory device according to claim 1, wherein the static random access memory cell has a static random access memory circuit, wherein the static random access memory circuit comprises a first storage node and a second storage node.

5. The static random access memory device according to claim 4, wherein each of the resistive-switching devices has a first connect terminal and a second connect terminal.

6. The static random access memory device according to claim 5, wherein the first connect terminals of the resistive-switching devices electrically connect the first storage node and the second storage node respectively.

7. The static random access memory device according to claim 6, wherein the second connect terminals of the resistive-switching devices electrically connect a common node.

8. The static random access memory device according to claim 1, wherein the resistive-switching devices comprise phase change devices (PCD).

9. The static random access memory device according to claim 1, wherein each of the resistive-switching devices comprises a first electrode, a second electrode and a resistive-switching material layer sandwiched by the first electrode and the second electrode.

10. The static random access memory device according to claim 9, wherein the resistive-switching material layer comprises a planar material layer or a non-planar material layer.

11. The static random access memory device according to claim 9, wherein the resistive-switching material layer comprises a germanium tellurium (GeTe) material layer or a selenium antimony tellurium (SeSbTe) material layer.

12. The static random access memory device according to claim 1, further comprising:
    a plurality of contact plugs disposed in the wafer.

13. The static random access memory device according to claim 12, wherein top surfaces of the contact plugs trim top surfaces of the body contacts.

14. A method of forming a static random access memory device, comprising:
    providing a wafer, wherein two body contacts are exposed from a backside of the wafer, and the body contacts electrically connect a static random access memory cell through a metal interconnect structure; and
    forming two resistive-switching devices connecting the body contacts respectively from the backside of the wafer.

15. The method of forming a static random access memory device according to claim 14, wherein the method of forming the wafer comprises:
    providing a substrate having a front side and a backside;
    forming the body contacts from the front side of the substrate; and
    forming the metal interconnect structure from the front side of the substrate, and the metal interconnect structure directly contacting the body contacts.

16. The method of forming a static random access memory device according to claim 15, wherein the body contacts are formed from the front side of the substrate, and the resistive-switching devices are formed the backside of the substrate.

17. The method of forming a static random access memory device according to claim 15, further comprising:
    forming a plurality of contact plugs in the substrate from the front side of the substrate when the body contacts are formed.

18. The method of forming a static random access memory device according to claim 14, wherein the body contacts physically connect a first metal layer of the metal interconnect structure.

19. The method of forming a static random access memory device according to claim 14, wherein the static random access memory cell has a static random access memory circuit comprising a first storage node and a second storage node, each of the resistive-switching devices has a first connect terminal and a second connect terminal, the first connect terminals of the resistive-switching devices electrically connect the first storage node and the second storage node respectively, and the second connect terminals of the resistive-switching devices electrically connect to a common node.

20. The method of forming a static random access memory device according to claim 14, wherein the resistive-switching devices overlap the static random access memory cell.

\* \* \* \* \*